United States Patent
Kim

(10) Patent No.: US 11,522,052 B2
(45) Date of Patent: Dec. 6, 2022

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Jin Ha Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 51 days.

(21) Appl. No.: 16/917,666

(22) Filed: Jun. 30, 2020

(65) Prior Publication Data

US 2021/0134956 A1    May 6, 2021

(30) Foreign Application Priority Data

Nov. 6, 2019    (KR) .......................... 10-2019-0140881

(51) Int. Cl.
| | | |
|---|---|---|
| *H01L 27/11568* | (2017.01) | |
| *H01L 29/10* | (2006.01) | |
| *H01L 27/11556* | (2017.01) | |
| *H01L 27/11582* | (2017.01) | |
| *H01L 27/24* | (2006.01) | |
| *H01L 25/18* | (2006.01) | |

(52) U.S. Cl.
CPC .......... *H01L 29/1037* (2013.01); *H01L 25/18* (2013.01); *H01L 27/11556* (2013.01); *H01L 27/11582* (2013.01); *H01L 27/2454* (2013.01); *H01L 2924/1434* (2013.01)

(58) Field of Classification Search
CPC ......... H01L 27/11556; H01L 27/11582; H01L 2225/06541; H01L 2225/06544; H01L 2225/06524; H01L 27/11575
See application file for complete search history.

(56) References Cited

U.S. PATENT DOCUMENTS

| | | | |
|---|---|---|---|
| 2016/0087055 A1* | 3/2016 | Cernea .............. | H01L 27/11556 257/315 |
| 2020/0020713 A1* | 1/2020 | Choi ................... | H01L 27/1157 |
| 2021/0313427 A1* | 10/2021 | Kim ........................ | H01L 24/08 |

FOREIGN PATENT DOCUMENTS

| KR | 1020170086941 A | 7/2017 |
|---|---|---|
| KR | 1020190005293 A | 1/2019 |

* cited by examiner

*Primary Examiner* — Sarah K Salerno
(74) *Attorney, Agent, or Firm* — William Park & Associates Ltd.

(57) ABSTRACT

A semiconductor device includes a stack including alternately stacked conductive films and insulating films, wherein the stack includes an opening penetrating the conductive films and the insulating films, and wherein the stack includes a rounded corner that is exposed to the opening. The semiconductor device also includes a first channel film formed in the opening and including a first curved surface surrounding the rounded corner. The semiconductor device further includes a conductive pad formed in the opening, and a second channel film interposed between the first curved surface of the first channel film and the conductive pad.

18 Claims, 13 Drawing Sheets

SEMICONDUCTOR DEVICE AND METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2019-0140881, filed on Nov. 6, 2019, in the Korean Intellectual Property Office, the entire disclosure of which is incorporated herein by reference.

BACKGROUND

1. Technical Field

The present disclosure relates to an electronic device, and more particularly, to a semiconductor device and a method of manufacturing the semiconductor device.

2. Related Art

A non-volatile memory element is a memory element in which stored data is maintained even though a power supply is cut off. Recently, as improvement of a degree of integration for two-dimensional non-volatile memory elements that form memory cells in a single layer on a substrate has reached a limit, three-dimensional non-volatile memory elements that vertically stack memory cells on a substrate has been proposed.

Three-dimensional non-volatile memory elements include interlayer insulating films and gate electrodes which are alternately stacked, and channel films passing through the interlayer insulating films and the gate electrodes. Memory cells are stacked along the channel films. Various structures and manufacturing methods have been developed to improve operation reliability of non-volatile memory elements having such a three-dimensional structure.

SUMMARY

A semiconductor device according to an embodiment of the present disclosure includes a stack including alternately stacked conductive films and insulating films, wherein the stack includes an opening penetrating the conductive films and the insulating films, and wherein the stack includes a rounded corner that is exposed to the opening. The semiconductor device also includes a first channel film formed in the opening and including a first curved surface surrounding the rounded corner. The semiconductor device also includes a conductive pad formed in the opening. The semiconductor device additionally includes a second channel film interposed between the first curved surface of the first channel film and the conductive pad.

A semiconductor device according to an embodiment of the present disclosure includes a source structure and a bit line. The semiconductor device also includes a stack, positioned between the source structure and the bit line, including alternately stacked conductive films and insulating films, wherein the stack includes an opening penetrating the conductive films and the insulating films, and wherein the stack includes a rounded corner that is exposed to the opening. The semiconductor device further includes a channel structure formed in the opening and connected to the source structure. The semiconductor device additionally includes a conductive pad connecting the channel structure and the bit line to each other and having a sidewall bent to surround the rounded corner.

A method of manufacturing a semiconductor device according to an embodiment of the present disclosure includes forming a stack, forming a first opening penetrating the stack, and forming a first channel film in the first opening. The method also includes locally forming a second channel film, which surrounds a corner that is exposed to the first opening, on the first channel film. The method includes forming a gap fill film on the first channel film and the second channel film. The method additionally includes forming a second opening by partially etching the gap fill film using the second channel film as an etching barrier, and forming a conductive pad in the second opening.

A method of manufacturing a semiconductor device according to an embodiment of the present disclosure includes forming a stack, forming a first opening penetrating the stack, and forming a first channel film including a first curved surface surrounding a corner that is exposed to the first opening. The method also includes forming a second channel film including a second curved surface surrounding the first curved surface, on the first channel film. The method further includes forming a gap fill film on the first channel film and the second channel film, forming a second opening by partially etching the gap fill film using the second channel film as an etching barrier, and forming a conductive pad having a sidewall bent to surround the second curved surface in the second opening.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Some embodiments of the present disclosure are directed to a semiconductor device and an improved method of manufacturing the semiconductor device, wherein the semiconductor device has a stable structure and enhanced reliability. The improved method of manufacturing might be of lower complexity, therefore reducing costs.

Figure 1A:
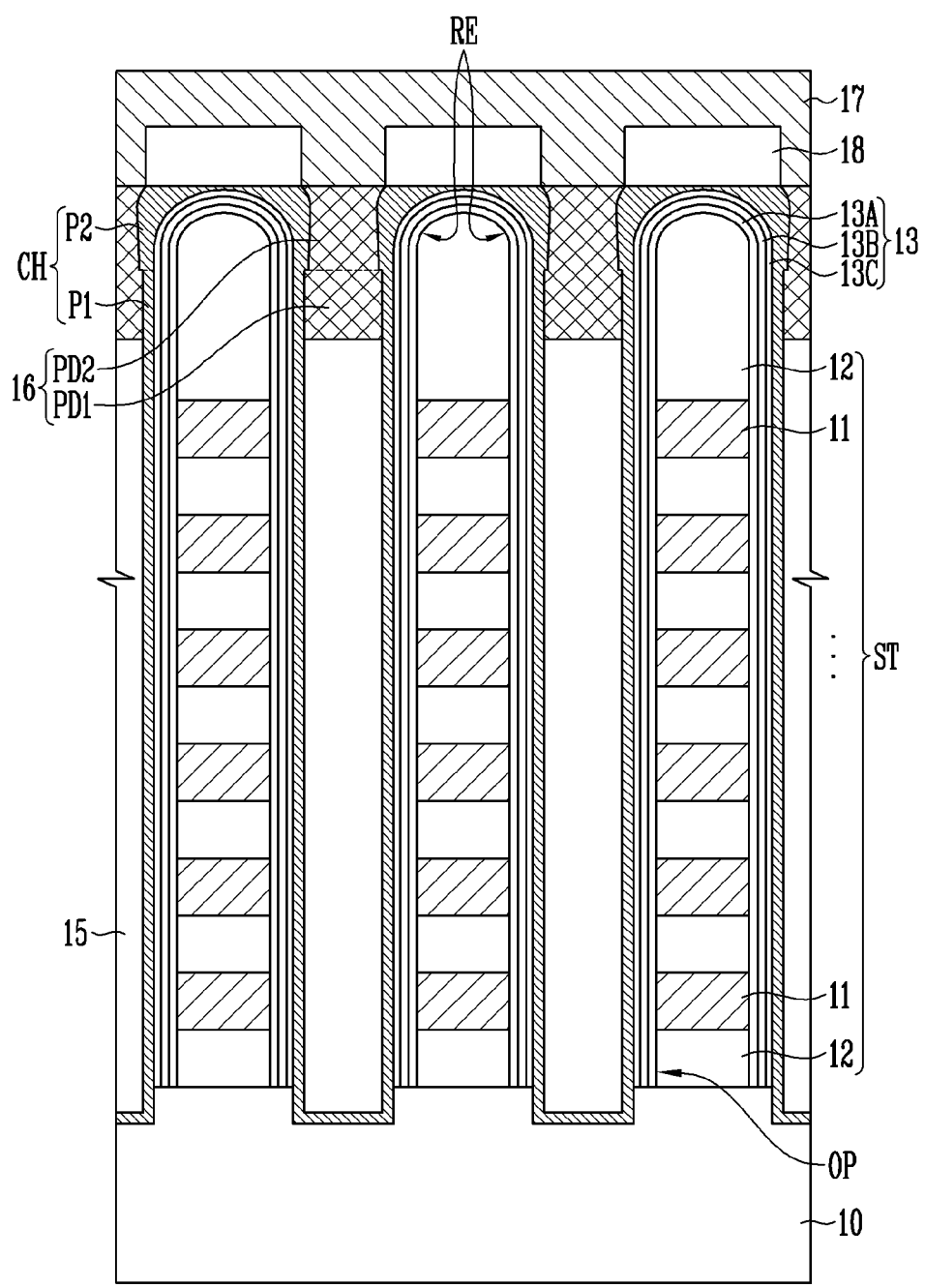
FIGS. 1A to 1C are cross-sectional views illustrating a structure of a semiconductor device according to an embodiment of the present disclosure.
Figure 1B:
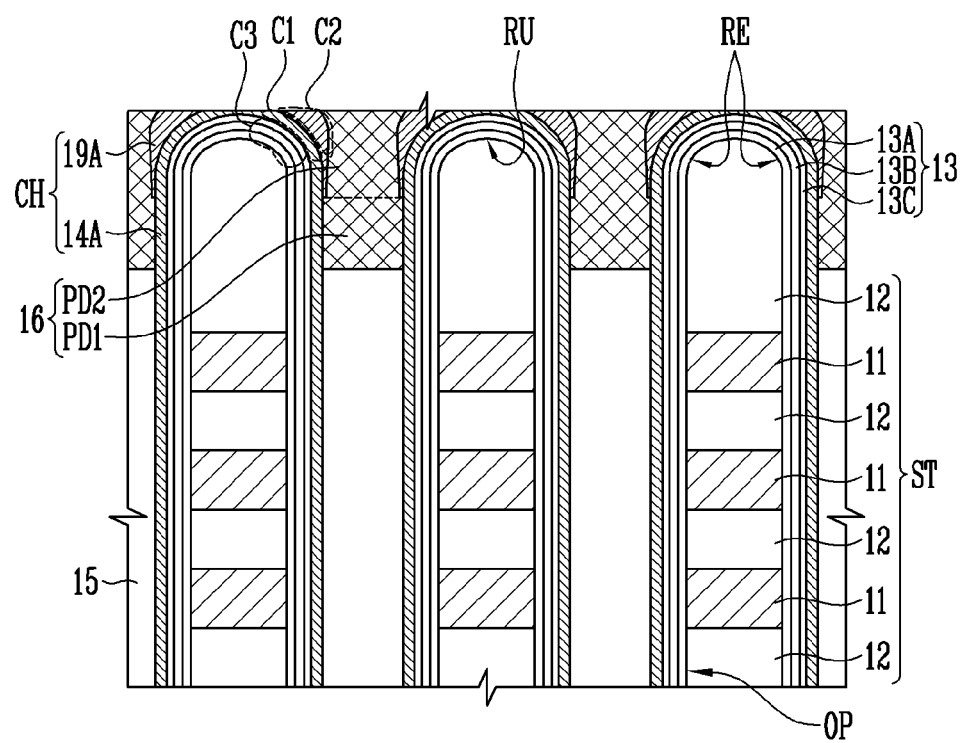
Figure 1C:
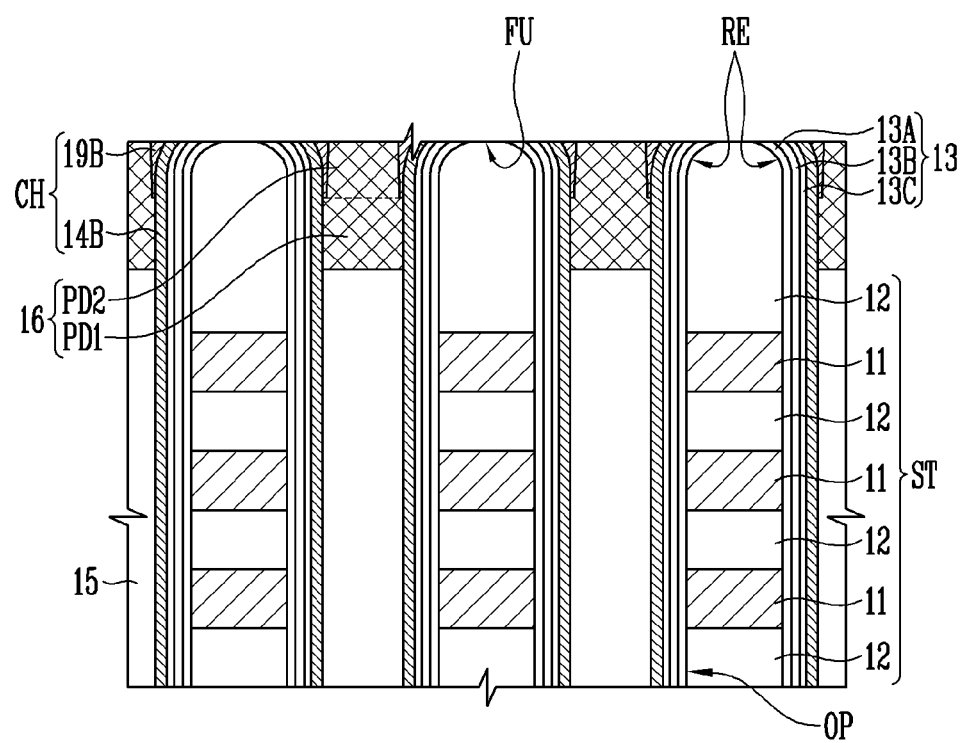

FIGS. 1A to 1C are cross-sectional views illustrating a structure of a semiconductor device according to an embodiment of the present disclosure.

Referring to FIG. 1A, the semiconductor device includes a stack ST, a channel structure CH, and a conductive pad 16. The semiconductor device may further include at least one of a source structure 10, a memory film 13, a gap fill film 15, a bit line 17, and an insulating film 18.

The stack ST may include conductive films 11 and insulating films 12 that are alternately stacked. The conductive films 11 may be select lines or word lines. The conductive films 11 may include at least one source select line, a plurality of word lines, and at least one drain select line. The insulating films 12 are for insulating the stacked conductive films 11 from each other and may include an insulating material such as an oxide or a nitride.

The stack ST may be positioned between the source structure 10 and an interconnect structure. For example, the stack ST may be positioned between the source structure 10 and the bit line 17. The source structure 10 may be a substrate including an impurity region or a source film including a conductive material. The source structure 10 may include silicon, polysilicon, metal, and the like. The source structure 10 may be a single film or a multilayer film. The bit line 17 may be formed in the insulating film 18.

The stack ST may include an opening OP. The opening OP may penetrate the stack ST in a stack direction. The stack direction may be a direction in which the conductive films 11 and the insulating films 12 are stacked. The opening OP may extend to the source structure 10 and may expose the source structure 10.

The stack ST may include a corner RE that is exposed to the opening OP, and may have a rounded shape. The corner RE may face the opening OP. Therefore, the opening OP may have a shape in which a width increases as a distance between the opening OP and the bit line 17 decreases.

The channel structure CH may penetrate the stack ST and may be formed in the opening OP. The channel structure CH may be connected between the source structure 10 and the bit line 17. A lower surface of the channel structure CH and the source structure 10 may be in contact with each other, a sidewall of the channel structure CH and the source structure 10 may be in contact with each other, or the lower surface and the sidewall of the channel structure CH may be in contact with the source structure 10. In addition, an epitaxial semiconductor layer may be positioned between the channel structure CH and the source structure 10, and the channel structure CH and the source structure 10 may be connected to each other by the epitaxial semiconductor layer. The channel structure CH may be electrically connected to the bit line 17 through the conductive pad 16.

The channel structure CH may be a region where a channel of a select transistor, a memory cell, and the like are formed. The channel structure CH may include a semiconductor material such as silicon (Si) or germanium (Ge). The select transistor or the memory cell may be positioned in a region where the channel structure CH and the conductive films 11 intersect. For example, at least one source select transistor, a plurality of memory cells, and at least one drain select transistor may be connected in series, and may configure one memory string. The memory string may be connected between the source structure 10 and the bit line 17.

The channel structure CH is formed along an inner surface of the opening OP. In addition, the channel structure CH may be formed to surround the rounded corner RE. Therefore, the channel structure CH may include a first portion P1 formed along the inner surface of the opening OP and a second portion P2 surrounding the rounded corner RE. The first portion P1 may have a tube shape, and the second portion P2 may have a funnel shape. The funnel shape may include an outer surface and the outer surface may include a wider diameter at one end and a narrower opening at the other end. The funnel shape may include an opening and the opening may include a wider diameter at one end and a narrower opening at the other end. An outer sidewall of the second portion P2 may include a curved surface surrounding the rounded corner RE.

The gap fill film 15 may be positioned in the opening OP and may be formed in the channel structure CH. The gap fill film 15 may completely fill or partially fill an inside of the channel structure CH, and may include a void. The gap fill film 15 may be a single film or a multilayer film. The gap fill film 15 may include an insulating material such as an oxide.

The conductive pad 16 may be positioned in the opening OP and may be formed in the channel structure CH. The conductive pad 16 may have a sidewall that is bent to surround the rounded corner RE.

The conductive pad 16 may be in contact with the gap fill film 15. A lower surface of the conductive pad 16 and an upper surface of the gap fill film 15 may be in contact with each other. The lower surface of the conductive pad 16 may be positioned higher than the upper surface of the uppermost conductive film 11 among the conductive films 11.

The conductive pad 16 may be in contact with the channel structure CH. The channel structure CH may be electrically connected to the bit line 17 through the conductive pad 16. The conductive pad 16 may include a conductive material such as polysilicon or tungsten.

The conductive pad 16 may have different thicknesses according to a region. The conductive pad 16 may include a first portion PD1 and a second portion PD2. The first portion PD1 of the conductive pad 16 may be in contact with the first portion P1 of the channel structure CH, and the second portion PD2 of the conductive pad 16 may be in contact with the second portion P2 of the channel structure CH.

The memory film 13 may be positioned in the opening OP and may be formed to surround the sidewall of the channel structure CH. The memory film 13 may be interposed between the stack ST and the channel structure CH. The memory film 13 may include a curved surface surrounding the rounded corner RE. The memory film 13 may extend to an upper surface of the stack ST. In addition, the memory films 13 formed in adjacent openings OP may be connected to each other.

The memory film 13 may include at least one of a charge block film 13A, a data storage film 13B, and a tunnel insulating film 13C. The data storage film 13B may include a floating gate, a charge trap material, polysilicon, nitride, a variable resistance material, a phase change material, a nano dot, or the like.

Referring to FIG. 1B, the stack ST may include an upper surface RU rounded between the adjacent openings OP. The memory film 13 may be formed to surround the rounded corner RE and the rounded upper surface RU. Therefore, the memory films 13 formed in the adjacent openings OP may be connected to each other. The channel structure CH may be formed to surround the rounded corner RE, and might not be formed on the upper surface RU. Therefore, the channel structures CH formed in the adjacent openings OP may be separated from each other.

The channel structure CH may include a first channel film 14A and a second channel film 19A. The first channel film 14A may penetrates the stack ST and may be formed along the inner surface of the opening OP. The first channel film 14A may include a first curved surface C1 surrounding the rounded corner RE. The second channel film 19A may include a second curved surface C2 surrounding the first curved surface C1 of the first channel film 14A. The memory film 13 may include a third curved surface C3 surrounding the rounded corner RE. The third curved surface C3 may be interposed between the rounded corner RE and the first curved surface C1, and the first curved surface C1 may be interposed between the second curved surface C2 and the third curved surface C3.

The first channel film 14A may be a region where a channel of a select transistor or a memory cell is formed. The second channel film 19A is for protecting the first curved surface C1 of the first channel film 14A and may be locally formed on the first curved surface C1. The second channel film 19A may be locally formed on the first channel film 14A so as to surround the corner that is exposed to the opening OP, and may have an overhang structure. The second channel film 19A may include substantially the same material as the first channel film 14A or may include a material different from that of the first channel film 14A. The first channel film 14A and the second channel film 19A may include a semiconductor material such as silicon (Si) or germanium (Ge).

The conductive pad 16 may have different thicknesses according to a region. The conductive pad 16 may include a first portion PD1 that is in contact with the first channel film 14A and a second portion PD2 that is in contact with the second channel film 19A. The first portion PD1 may have a uniform width. The second portion PD2 may have a narrower width than the first portion PD1, and a width may increase as a distance between the second portion PD2 and the portion PD1 increases.

Referring to FIG. 1C, the stack ST may include a flat upper surface FU between the adjacent openings OP. The memory film 13 and the channel structure CH may be formed to surround the rounded corner RE. The memory film 13 and the channel structure CH are not formed on the flat upper surface FU of the stack ST. Therefore, the memory films 13 formed in the adjacent openings OP may be separated from each other, and the channel structures CH formed in the adjacent openings OP may be separated from each other.

The channel structure CH may include a first channel film 14B and a second channel film 19B. A ratio occupied by a curved surface of the entire area in the first channel film 14B may be less than that of the first channel film 14A of FIG. 1B, and a ratio occupied by a curved surface of the entire area in the second channel film 19B may be less than that of the second channel film 19A of FIG. 1B. At least one of the first channel film 14B and the second channel film 19B might not include a curved surface.

According to the structure as described above, the channel structure CH has different thicknesses according to the region. A region of the channel structure CH corresponding to the memory cell may have a thin thickness and may improve a distribution characteristic and a temperature switching characteristic of the memory cell. In addition, a region of the channel structure CH corresponding to the conductive pad 16 may have a thick thickness, and the conductive pads 16 may be formed at a uniform depth in the openings OP. Therefore, the select transistors may have uniform junction overlap, and an erase operation using a gate-induced drain leakage (GIDL) method may be improved.

Figure 2:
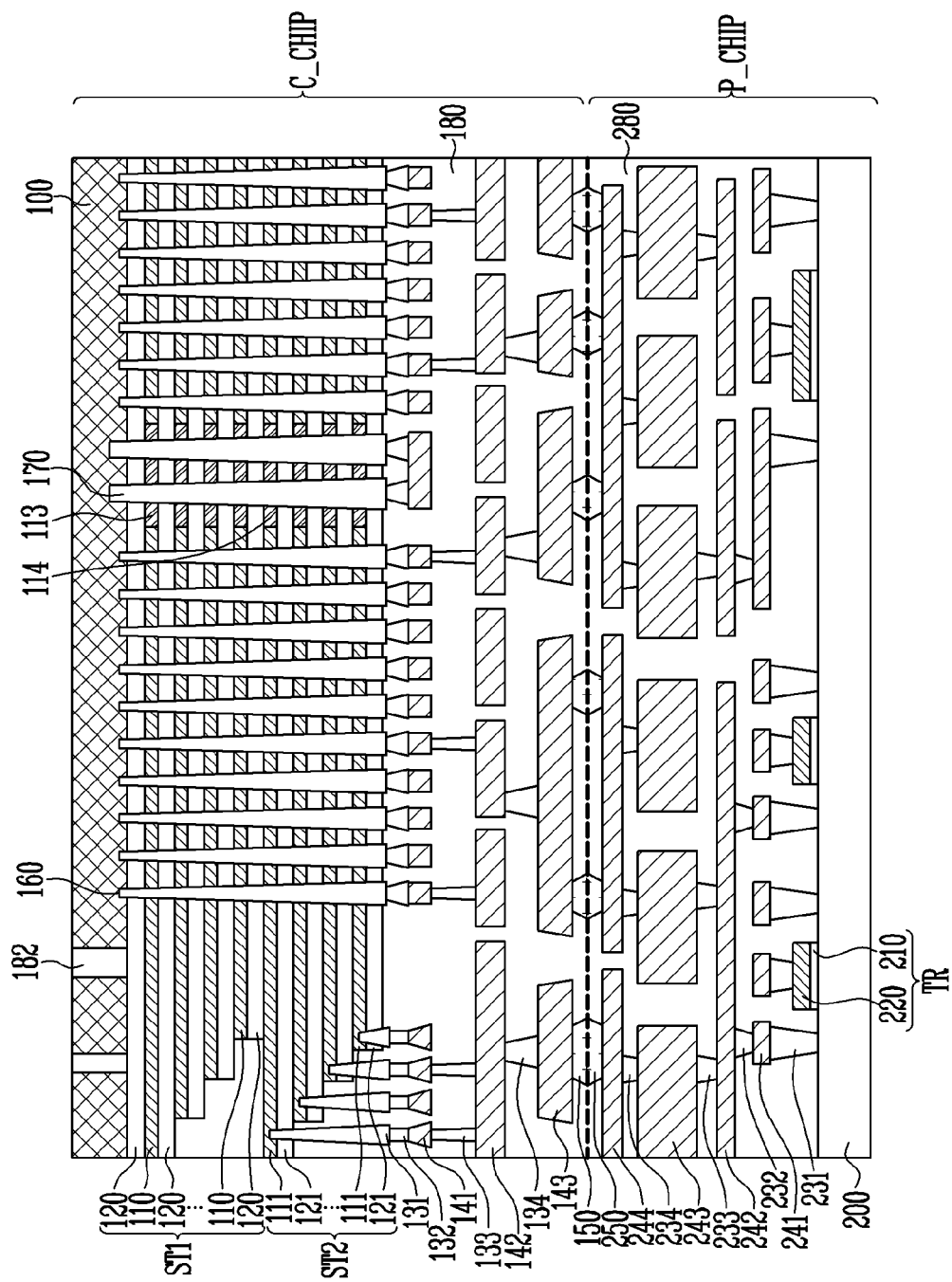
FIG. 2 is a cross-sectional view illustrating a structure of a semiconductor device according to an embodiment of the present disclosure.

FIG. 2 is a cross-sectional view illustrating a structure of the semiconductor device according to an embodiment of the present disclosure. Hereinafter, description repetitive to the above description will be omitted.

Referring to FIG. 2, the semiconductor device includes a cell chip C_CHIP and a peripheral circuit chip P_CHIP bonded to the cell chip C_CHIP. The cell chip C_CHIP may be positioned on the peripheral circuit chip P_CHIP, or the peripheral circuit chip P_CHIP may be positioned on the cell chip C_CHIP.

The cell chip C_CHIP may include a source film 100, a first stack ST1, a second stack ST2, interconnection structures 131 to 134 and 141 to 143, a first bonding structure 150, a channel structure 160, a source contact structure 170, and a first interlayer insulating film 180.

The first stack ST1 may include first conductive films 110 and first insulating films 120 that are alternately stacked. The second stacks ST2 may include second conductive films 111 and second insulating films 121 that are alternately stacked.

The first stack ST1 may include first sacrificial films 113 instead of the first conductive films 110, in a partial region. In this case, the first sacrificial films 113 and the first insulating films 120 may be alternately stacked in the partial region. The second stack ST2 also may include second sacrificial films 114 and the second insulating films 121 that are alternately stacked in a partial region. The first and second sacrificial films 113 and 114 may include a dielectric material such as nitride.

The first stack ST1 may include a cell region in which memory strings are positioned and a contact region in which an interconnection structure is connected. The second stack ST2 may also include a cell region and a contact region. The contact regions of the first and second stacks ST1 and ST2 may have a step shape.

The first stack ST1 and the second stack ST2 may be stacked up and down. For example, the first stack ST1 may be positioned on the second stack ST2. In addition, the cell region of the first stack ST1 and the cell region of the second stack ST2 overlap in a stack direction, and the contact region of the first stack ST1 and the contact of the second stack ST2 may overlap in the stack direction.

The source film 100 may be positioned on the first stack ST1. The source film 100 may be patterned, and an insulating film 182 may be filled between the adjacent source films 100. The insulating film 182 may be positioned in correspondence with the contact regions of the first and second stacks ST1 and ST2.

The channel structure 160 penetrates the first and second stacks ST1 and ST2. The channel structure 160 may be connected to the source film 100 and may be protruded into the source film 100. The channel structure 160 may include a first channel film and a second channel film. The first channel film and the second channel film may have the structure of the embodiment described above with reference to FIGS. 1A to 1C. In addition, although not shown in the present drawing, the conductive pad and the gap fill film may be formed in the channel structure 160, and the memory film may be formed on a sidewall of the channel structure 160.

The source contact structure 170 may penetrate the first and second stacks ST1 and ST2 and may be connected to the source film 100. The source contact structure 170 may be protruded into the source film 100 deeper than the channel structure 160. In addition, the source contact structure 170 may have a larger diameter than the channel structure 160.

The source contact structure 170 may penetrate the first conductive films 110, the first insulating films 120, the second conductive films 111, and the second insulating films 121, or may penetrate the first sacrificial films 113, the first insulating films 120, the second sacrificial films 114, and the second insulating films 121. Here, the first sacrificial films 113 may be films partially remained in a process of replacing the first sacrificial films 113 with the first conductive films 110. The second sacrificial films 114 may be films partially remained in a process of replacing the second sacrificial films 114 with the second conductive films 111.

The source contact structure 170 may include a contact plug, and the contact plug may include a conductive material such as polysilicon, tungsten, or metal. In addition, the source contact structure 170 may further include an insulating spacer surrounding a sidewall of the contact plug, and the insulating spacer may include an insulating material such as an oxide or a nitride.

The interconnection structures 131 to 134 and 141 to 143 may include contact plugs 131 to 134 and wires 141 to 143. The interconnection structures 131 to 134 and 141 to 143 may be formed in the first interlayer insulating film 180. Although the first interlayer insulating film 180 is shown as one film in the present drawing, the first interlayer insulating film 180 may include stacked insulating films.

First contact plugs 131 may be connected to the stacked first conductive films 110 or second conductive films 111, respectively. Second contact plugs 132 may be connected to the first contact plugs 131, the channel structures 160, or the source contact structures 170. The second contact plugs 132 may electrically connect the first contact plugs 131 and first wires 141 to each other. Third contact plugs 133 may be connected to the first wires 141 and may electrically connect the first wires 141 and second wires 142 to each other. Fourth contact plugs 134 may be connected to the second wires 142 and may electrically connect the second wires 142 and third wires 143 to each other.

The first bonding structure 150 is for electrically connecting the cell chip C_CHIP and the peripheral circuit chip P_CHIP to each other. The first bonding structure 150 may have a form of a contact plug, a wire, or the like. The first bonding structures 150 may be electrically connected to the third wires 143.

The peripheral circuit chip P_CHIP may include a substrate 200, a transistor TR, interconnection structures 231 to 234 and 241 to 244, a second bonding structure 250, and a second interlayer insulating film 280.

The transistor TR may include a gate electrode 220 and a gate insulating film 210. The gate insulating film 210 may be interposed between the substrate 200 and the gate electrode 220. Although not shown in the present drawing, the transistor TR may further include a junction in the substrate 200.

The interconnection structures 231-234 and 241-244 may include contact plugs 231 to 234 and wires 241 to 244. The interconnection structures 231 to 234 and 241 to 244 may be formed in the second interlayer insulating film 280. Although the second interlayer insulating film 280 is shown as one film in the present drawing, the second interlayer insulating film 280 may include stacked insulating films.

Fifth contact plugs 231 may be connected to the gate electrode 220 or the junction of the transistor TR. Fourth wires 241 may be electrically connected to the fifth contact plugs 231. Sixth contact plugs 232 may electrically connect the fourth wires 241 and fifth wires 242 to each other. Seventh contact plugs 233 may electrically connect the fifth wires 242 and sixth wires 243 to each other. Eighth contact plugs 234 may electrically connect the sixth wires 243 and seventh wires 244 to each other.

The second bonding structure 250 is for electrically connecting the cell chip C_CHIP and the peripheral circuit chip P_CHIP to each other. The second bonding structure 250 may have a form of a contact plug, a wire, or the like. The second bonding structures 250 are electrically connected to the seventh wires 244. The second bonding structures 250 may be in contact with the first bonding structures 150 of the cell chip C_CHIP. Therefore, the cell chip C_CHIP and the peripheral circuit chip P_CHIP may be electrically connected to each other through the first and second bonding structures 150 and 250. For example, the cell chip C_CHIP and the peripheral circuit chip P_CHIP may be connected to each other by bonding the first bonding structures 150 and the second bonding structures 250 to each other and bonding the first interlayer insulating film 180 and the second interlayer insulating film 280 to each other. Therefore, the first and second stacks ST1 and ST2 are positioned between the substrate 200 and the source film 100.

According to the structure described above, the cell chip C_CHIP and the peripheral circuit chip P_CHIP may be bonded to each other after manufacturing each of the cell chip C_CHIP and the peripheral circuit chip P_CHIP. In addition, because the channel structure 160 has different thicknesses according to the region, the erase operation may be improved and improve a swing characteristic of the memory cell may be improved.

FIGS. 3A to 3G are cross-sectional views illustrating a method of manufacturing the semiconductor device according to an embodiment of the present disclosure. Hereinafter, description repetitive to the above description will be omitted.

Figure 3A:
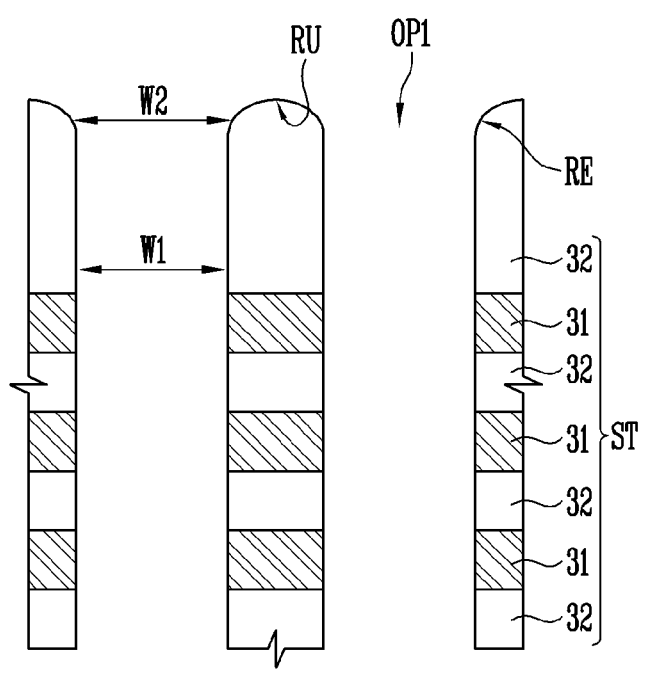
FIGS. 3A to 3G are cross-sectional views illustrating a method of manufacturing a semiconductor device according to an embodiment of the present disclosure.

Referring to FIG. 3A, the stack ST is formed on a base (not shown). The base may include a source structure, an interconnection, a peripheral circuit, and the like. The source structure may include a substrate including a source region, a source film, and the like.

The stack ST may include first material films 31 and second material films 32 that are alternately stacked. The first material films 31 may be forming the memory cell, the gate electrode of the select transistor, and the like, and the second material films 32 may be forming insulating stacked gate electrodes from each other.

The first material films 31 may include a material having a high etching selectivity with respect to the second material films 32. For example, the first material films 31 may be sacrificial films including nitride and the like, and the second material films 32 may be insulating films including oxide and the like. As another example, the first material films 31 may be conductive films including polysilicon, tungsten, and the like, and the second material films 32 may be insulating films including an oxide and the like.

Next, a first opening OP1 penetrating the stack ST is formed. The first opening OP1 may extend to the base such as the source structure. The stack ST may include the corner RE that is exposed to the first opening OP1, and the corner RE may have a rounded shape. The first opening OP1 may have an increased width W2>W1 between the rounded corner RE.

In addition, the stack ST may have the upper surface RU rounded between adjacent first openings OP1. For reference, the stack ST may have an upper surface flat between the adjacent first openings OP1.

Figure 3B:
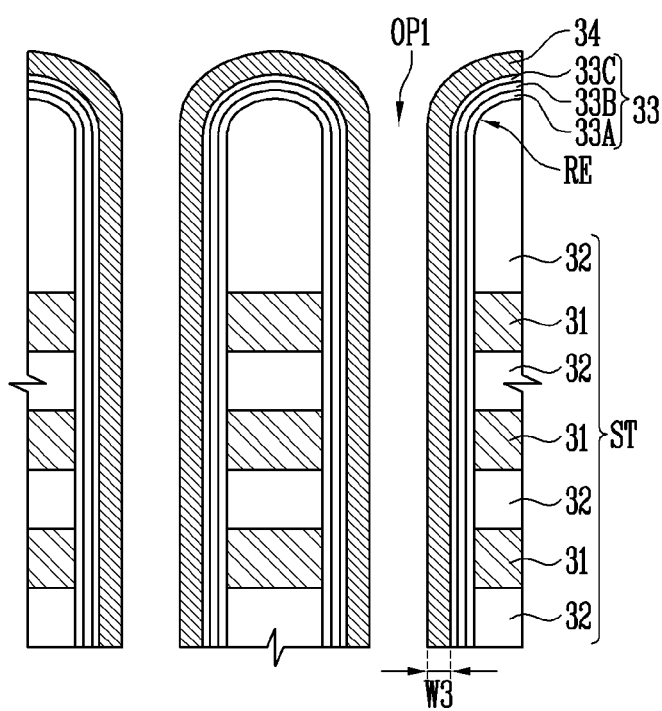

Referring to FIG. 3B, the memory film 33 is formed in the first opening OP1. The memory film 33 may be formed along an inner surface of the first opening OP1 and an upper surface of the stack ST. The memory film 33 may include at least one of the charge block film 33A, the data storage film 33B, and the tunnel insulating film 33C. The memory film 33 may include a curved surface surrounding the rounded corner RE. In addition, the memory film 33 may include a curved surface surrounding the rounded upper surface RU.

Next, the first channel film 34 is formed in the first opening OP1. The first channel film 34 may be formed on the memory film 33. The first channel film 34 may be formed along the inner surface of the first opening OP1 and the upper surface of the stack ST. The first channel film 34 may include a curved surface surrounding the rounded corner RE. In addition, the first channel film 34 may include a curved surface surrounding the rounded upper surface RU.

The first channel film 34 may be formed using a deposition process, and may be formed at a uniform thickness. The first channel film 34 may be formed at a third thickness W3. The first channel film 34 may include a polysilicon film. For example, after an amorphous silicon film is formed in the first opening OP1, the amorphous silicon film may be crystallized to form the polysilicon film. The amorphous silicon film may be crystallized using a heat treatment process.

Figure 3C:
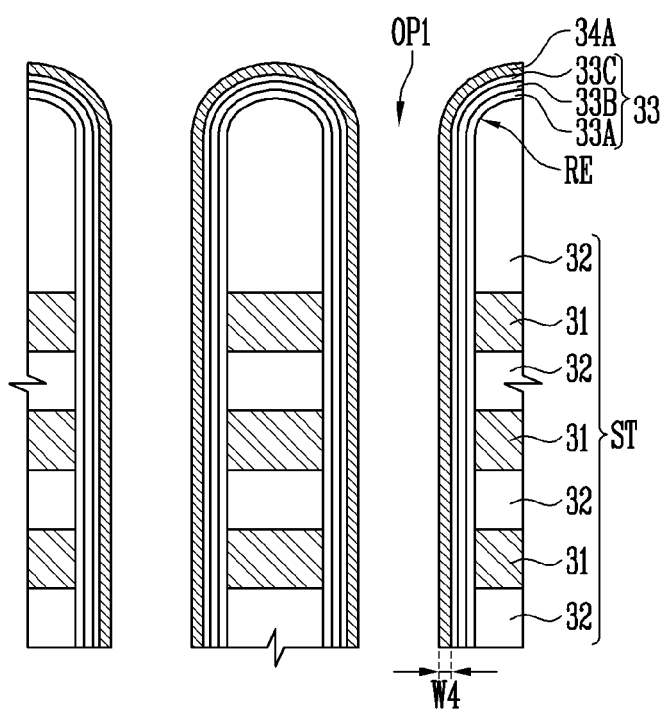

Referring to FIG. 3C, the first channel film 34 may be partially etched to reduce the thickness of the first channel film 34 as a whole. For example, the first channel film 34 is etched or an oxidized region is etched after partially oxidizing the first channel film 34. An etching process may be performed using an isotropic etching process, and the isotropic etching process may be a wet etching process. Therefore, the thickness of the first channel film 34 may be reduced from the third thickness W3 to a fourth thickness W4.

Figure 3D:
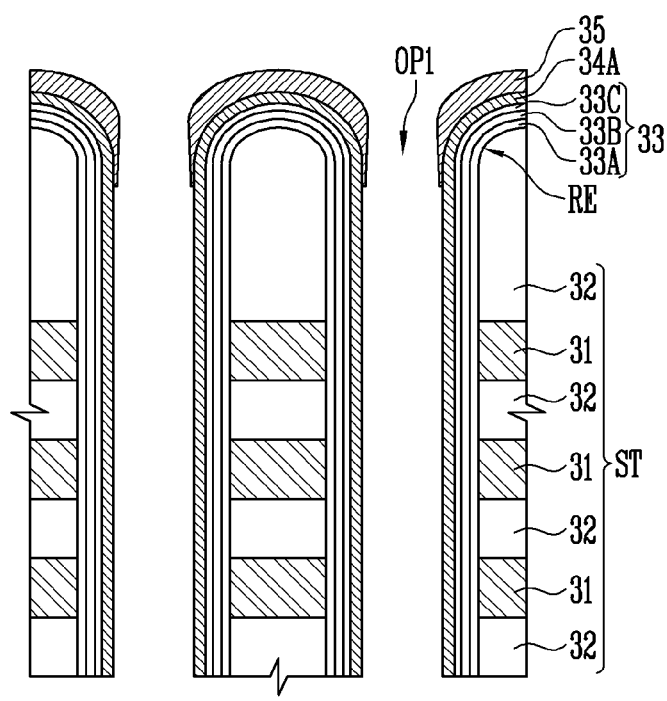

Referring to FIG. 3D, the second channel film 35 is formed on the first channel film 34A. The second channel film 35 may be locally formed on the first channel film 34A to surround the curved surface of the first channel film 34A. The second channel film 35 may be formed using a deposition method in which step coverage is bad. For example, the second channel film 35 is formed by using a plasma enhanced chemical vapor deposition (PECVD) method. The second channel film 35 may include a curved surface surrounding the curved surface of the first channel film 34A, and may be locally formed on the first channel film 34A.

The second channel film 35 may include a polysilicon film, and may be formed at a thickness of 50 angstroms (Å) to 200 Å. For example, the second silicon film 35 is formed by depositing the polysilicon film. Alternatively, after an amorphous silicon film is locally formed on the first channel film 34A, the amorphous silicon film is crystallized to form the second channel film 35.

For reference, in FIG. 3B, the amorphous silicon film of the first channel film 34 is crystallized before the second channel film 35 is formed. However, an amorphous silicon film of the first channel film 34 may be crystalized after the second channel film 35 is formed.

Figure 3E:
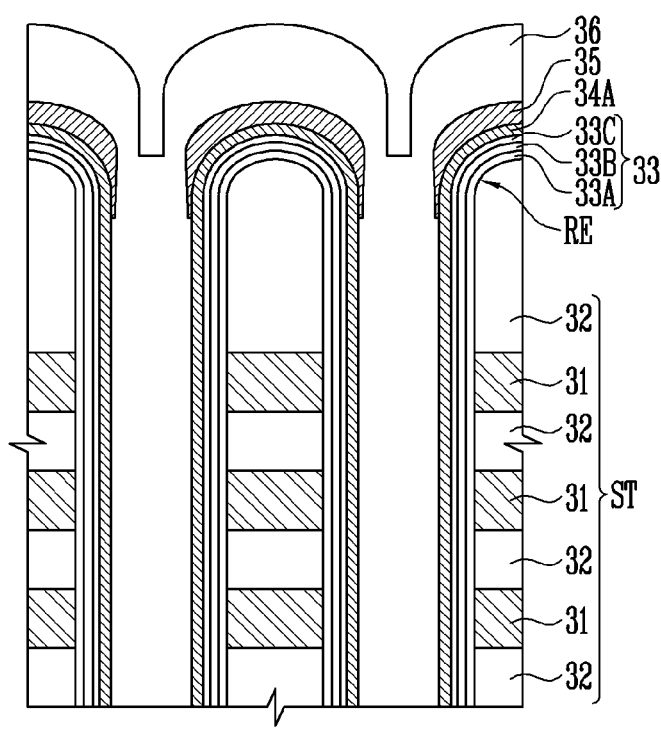

Referring to FIG. 3E, the gap fill film 36 is formed on the first channel film 34A and the second channel film 35. The gap fill film 36 may be formed to fill the first opening OP1, and may be formed on the stack ST. The gap fill film 36 may include a void positioned in the first opening OP1. The gap fill film 36 may be formed using plasma or may be formed using an atomic layer deposition (ALD) method.

Figure 3F:
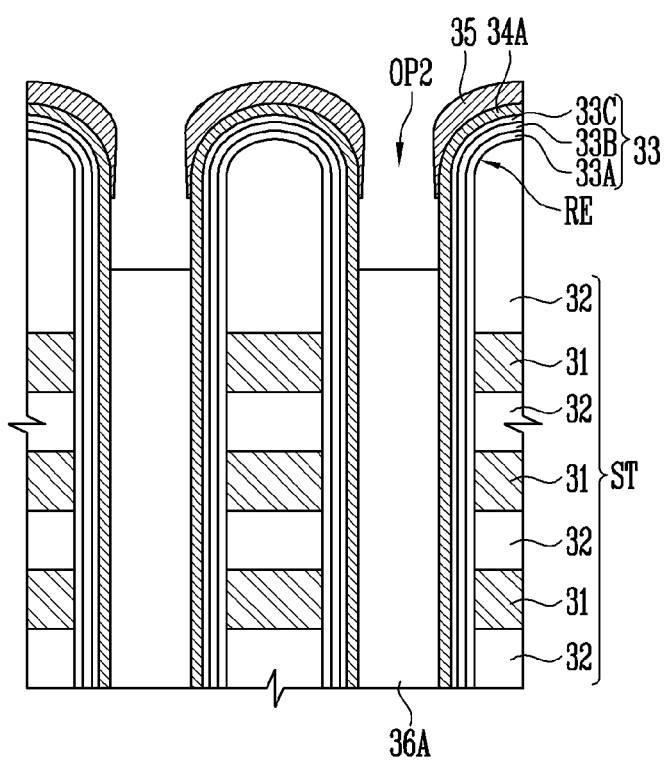

Referring to FIG. 3F, the gap fill film 36 is partially etched to form a second opening OP2. The second opening OP2 may be formed to expose the first channel film 34A and the second channel film 35. The gap fill film 36 may be etched using a dry etching process. For example, the gap fill film 36 is etched using a dry cleaning process.

Meanwhile, in a process of forming or etching the gap fill film 36, films positioned adjacent to the rounded corner RE may be damaged. Because a region formed at the rounded corner RE of the first channel film 34A is exposed to a deposition or etching environment (for example, plasma) more than the remaining regions, the corresponding region may be etched and damaged. In addition, because the first channel film 34A is etched, the memory film 33 and the stack ST formed at the rounded corner RE may be exposed, and may also be etched and damaged. Therefore, the second openings OP2 may be formed at a non-uniform depth.

However, according to an embodiment of the present disclosure, the curved surface of the first channel film 34A may be protected by the second channel film 35. That is, because the region formed at the rounded corner RE of the first channel film 34A is protected, the first channel film 34A may be prevented from being damaged in the process of forming or etching the gap fill film 36. In addition, the second openings OP2 may be formed at a uniform depth.

Figure 3G:
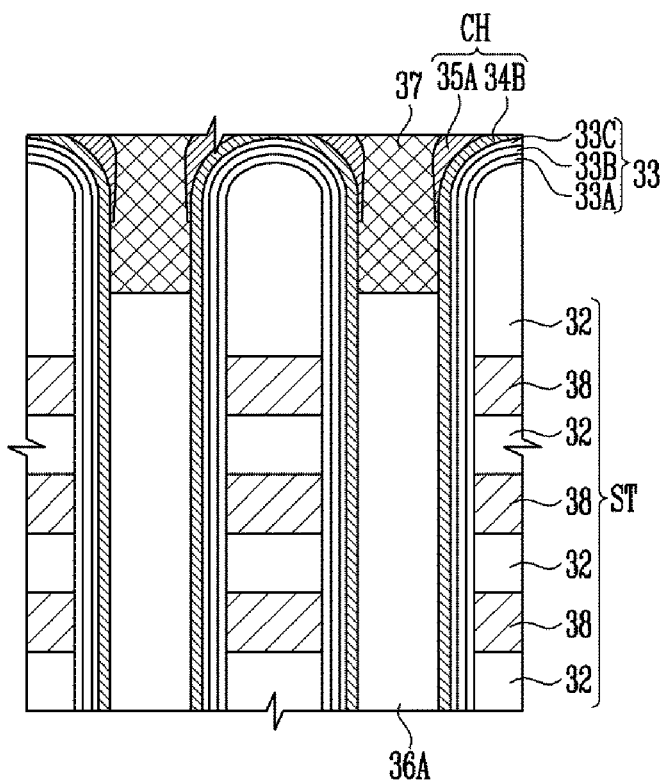

Referring to FIG. 3G, conductive pads 37 are formed in the second openings OP2, respectively. For example, after forming a conductive film on the stack ST to fill the second openings OP2, the conductive film is planarized to form the conductive pads 37. Each of the conductive pads 37 may have a sidewall that is bent to surround the curved surface of the second channel film 35.

A planarization process may be performed using a chemical mechanical polishing (CMP) process. The planarization process may be performed until an upper surface of the memory film 33 is exposed, or may be performed until the upper surface of the stack ST is exposed. The stack ST may be partially etched in the planarization process, and the stack ST may have a flat upper surface. In addition, the first channel film 34A and the second channel film 35 may be partially polished in the planarization process. Therefore, the channel structure CH including the first channel film 34B and the second channel film 35A is formed.

Next, the first material films 31 are replaced with third material films 38. For example, when the first material films 31 are sacrificial films and the second material films 32 are insulating films, the first material films 31 are replaced with conductive films. As another example, when the first material films 31 are conductive films and the second material films 32 are insulating films, the first material films 31 are caused to be silicide.

Next, although not shown in the present drawing, the interconnect structure connected to the channel structure CH is formed. For example, the bit line connected to the channel structure CH is formed on the stack ST.

Meanwhile, the manufacturing method described with reference to FIGS. 3A to 3G may be applied when the cell chip C_CHIP described above with reference to FIG. 2 is manufactured. Therefore, a process of forming the peripheral circuit chip PERI_CHIP manufactured by a separate process and bonding the cell chip C_CHIP and the peripheral circuit chip PERI_CHIP to each other may be further performed.

According to the manufacturing method as described above, the curved surface of the first channel film 34A may be protected by the second channel film 35. Therefore, even though the first channel film 34A has a thin thickness, the first channel film 34A may be prevented from being damaged in the process of forming or etching the gap fill film 36. In addition, the conductive pads 37 may be formed at a uniform thickness.

Figure 4:
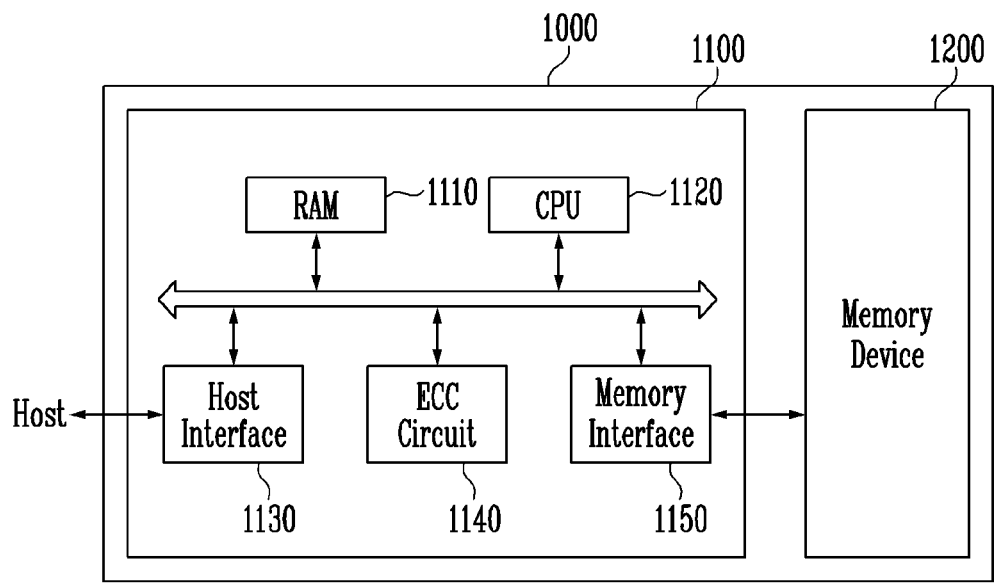
FIG. 4 is a block diagram illustrating a configuration of a memory system according to an embodiment of the present disclosure.

FIG. 4 is a block diagram illustrating a configuration of a memory system 1000 according to an embodiment of the present disclosure.

Referring to FIG. 4, the memory system 1000 includes a memory device 1200 and a controller 1100.

The memory device 1200 is used to store data information having various data types such as a text, a graphic, and a software code. The memory device 1200 may be a non-volatile memory device. In addition, the memory device 1200 may have the structure described above with reference to FIGS. 1A to 3G, and may be manufactured according to the manufacturing method described with reference to FIGS. 1A to 3G. As an embodiment, the memory device 1200 may include a stack including alternately stacked conductive films and insulating films, and an opening penetrating the conductive films and the insulating films, and having a rounded corner that is exposed to the opening, a first channel film formed in the opening and including a first curved surface surrounding the rounded corner, a conductive pad formed in the opening, and a second channel film interposed between the first curved surface of the first channel film and the conductive pad. Because a structure of the memory device 1200 and a method of manufacturing the memory device 1200 are the same as described above, a detailed description thereof will be omitted here.

The controller 1100 is connected to a host and the memory device 1200 and is configured to access the memory device 1200 in response to a request from the host. For example, the controller 1100 is configured to control read, write, erase, and background operations, and the like of the memory device 1200.

The controller 1100 includes random access memory (RAM) 1110, a central processing unit (CPU) 1120, a host interface 1130, an error correction code circuit 1140, a memory interface 1150, and the like.

Here, the RAM 1110 may be used as operation memory of the CPU 1120, cache memory between the memory device 1200 and the host, buffer memory between the memory device 1200 and the host, and the like. For reference, the RAM 1110 may be replaced with static random access memory (SRAM), read only memory (ROM), or the like.

The CPU 1120 is configured to control overall operation of the controller 1100. For example, the CPU 1120 is configured to operate firmware such as a flash translation layer (FTL) stored in the RAM 1110.

The host interface 1130 is configured to perform interfacing with the host. For example, the controller 1100 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data read from the memory device 1200 using an error correction code (ECC).

The memory interface 1150 is configured to perform interfacing with the memory device 1200. For example, the memory interface 1150 includes a NAND interface or a NOR interface.

For reference, the controller 1100 may further include buffer memory (not shown) for temporarily storing data. Here, the buffer memory may be used to temporarily store data transferred to the outside through the host interface 1130, or to temporarily store data transferred from the memory device 1200 through the memory interface 1150. In addition, the controller 1100 may further include ROM that stores code data for interfacing with the host.

As described above, because the memory system 1000 includes the memory device 1200 having an improved degree of integration and an improved operation characteristic, a degree of integration and an operation characteristic of the memory system 1000 may also be improved.

Figure 5:
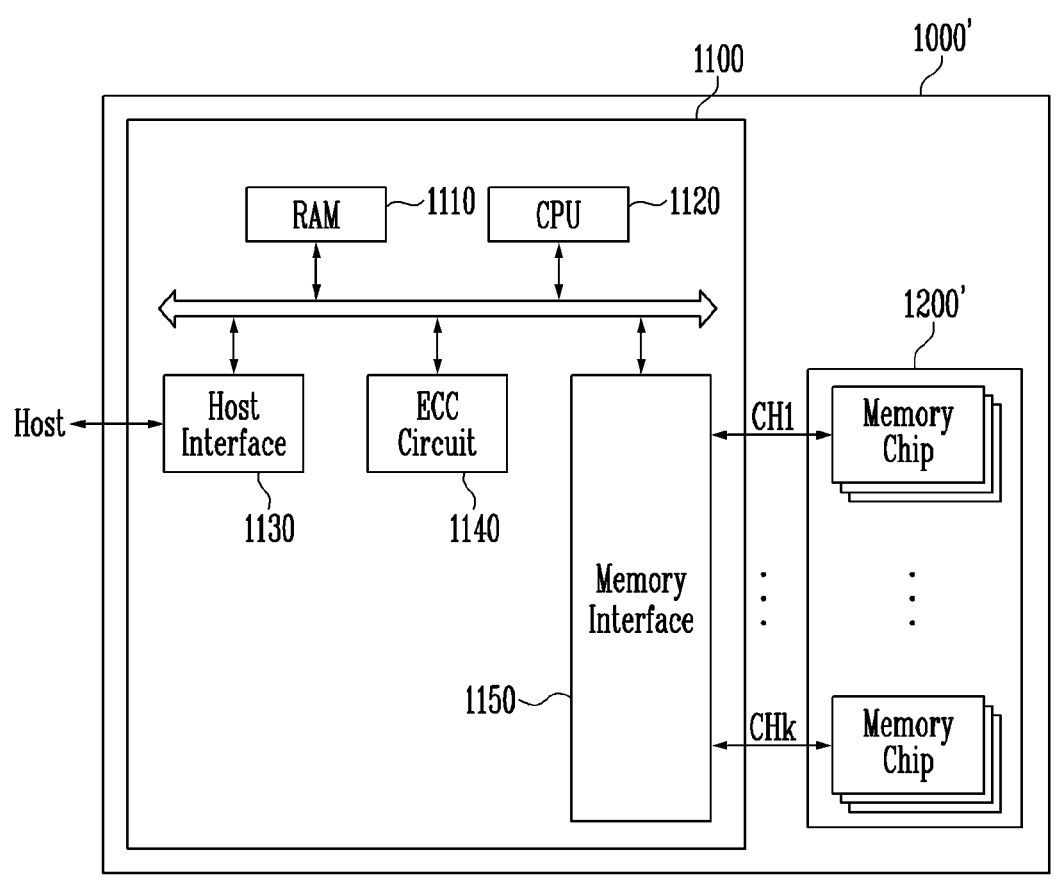
FIG. 5 is a block diagram illustrating a configuration of a memory system according to an embodiment of the present disclosure.

FIG. 5 is a block diagram illustrating a configuration of a memory system 1000' according to an embodiment of the present disclosure. Hereinafter, descriptions repetitive to the above description will be omitted.

Referring to FIG. 5, the memory system 1000' includes a memory device 1200' and a controller 1100. In addition, the controller 1100 includes RAM 1110, a CPU 1120, a host interface 1130, an ECC circuit 1140, a memory interface 1150, and the like.

The memory device 1200' may be a non-volatile memory device. The memory device 1200' may have the structure described above with reference to FIGS. 1A to 3G, and may be manufactured according to the manufacturing method described with reference to FIGS. 1A to 3G. As an embodiment, the memory device 1200' may include a stack including alternately stacked conductive films and insulating films, and an opening penetrating the conductive films and the insulating films, and having a rounded corner that is in contact with (exposed to) the opening, a first channel film formed in the opening and including a first curved surface surrounding the rounded corner, a conductive pad formed in the opening, and a second channel film interposed between the first curved surface of the first channel film and the conductive pad. Because a structure of the memory device 1200' and a method of manufacturing the memory device 1200' are the same as described above, a detailed description thereof will be omitted here.

In addition, the memory device 1200' may be a multi-chip package configured of a plurality of memory chips. The plurality of memory chips are divided into a plurality of groups, and the plurality of groups are configured to communicate with the controller 1100 through first to k-th channels CH1 to CHk. In addition, the memory chips belonging to one group are configured to communicate with the controller 1100 through a common channel. For reference, the memory system 1000' may be modified such that one memory chip is connected to one channel.

As described above, because the memory system 1000' includes the memory device 1200' having an improved degree of integration and an improved operation characteristic, a degree of integration and an operation characteristic of the memory system 1000' may also be improved. In particular, by configuring the memory device 1200' in a multi-chip package, data storage capacity of the memory system 1000' may be increased and a driving speed may be improved.

Figure 6:
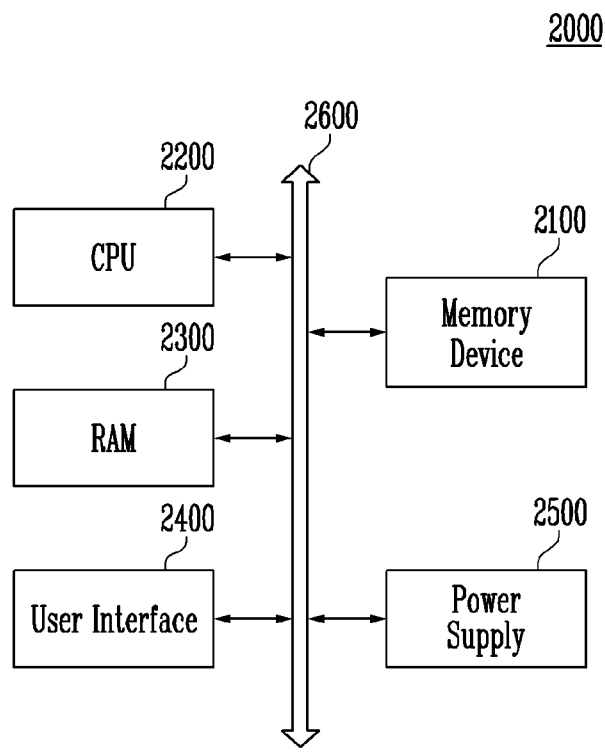
FIG. 6 is a block diagram illustrating a configuration of a computing system according to an embodiment of the present disclosure.

FIG. 6 is a block diagram illustrating a configuration of a computing system 2000 according to an embodiment of the present disclosure. Hereinafter, descriptions repetitive to the above description will be omitted.

Referring to FIG. 6, the computing system 2000 includes a memory device 2100, a CPU 2200, RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, a function of the controller may be performed by the CPU 2200, the RAM 2300, and the like.

Here, the memory device 2100 may be a non-volatile memory device. The memory device 2100 may have the structure described above with reference to FIGS. 1A to 3G, and may be manufactured according to the manufacturing method described with reference to FIGS. 1A to 3G. As an embodiment, the memory device 2100 may include a stack including alternately stacked conductive films and insulating films, and an opening penetrating the conductive films and the insulating films, and having a rounded corner that is in contact with (exposed to) the opening, a first channel film formed in the opening and including a first curved surface surrounding the rounded corner, a conductive pad formed in the opening, and a second channel film interposed between the first curved surface of the first channel film and the conductive pad. Because a structure of the memory device 2100 and a method of manufacturing the memory device 2100 are the same as described above, a detailed description thereof will be omitted here.

In addition, the memory device 2100 may be a multi-chip package including a plurality of memory chips as described with reference to FIG. 5.

The computing system having such a configuration may be a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or the like.

As described above, because the computing system 2000 includes the memory device 2100 having an improved degree of integration and an improved operation characteristic, an operation characteristic of the computing system 2000 may also be improved.

Figure 7:
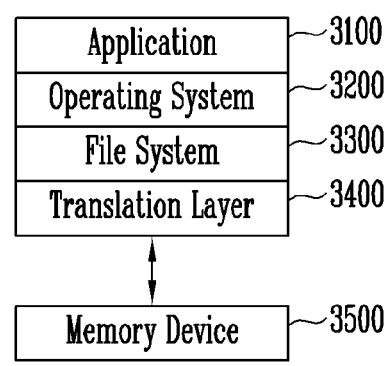
FIG. 7 is a block diagram illustrating a computing system according to an embodiment of the present disclosure.

FIG. 7 is a block diagram illustrating a computing system 3000 according to an embodiment of the present disclosure.

Referring to FIG. 7, the computing system 3000 includes a software layer including an operating system 3200, an application 3100, a file system 3300, a translation layer 3400, and the like. In addition, the computing system 3000 includes a hardware layer such as a memory device 3500.

The operating system 3200 is for managing software, hardware resources, and the like of the computing system 3000, and may control program execution of a central processing unit. The application 3100 may be various application programs executed on the computing system 3000 and may be a utility that is executed by the operating system 3200.

The file system 3300 refers to a logical structure for managing data, a file, and the like existing in the computing system 3000, and organizes the file or data to be stored in the memory device 3500 according to a rule. The file system 3300 may be determined according to the operating system 3200 used in the computing system 3000. For example, when the operating system 3200 is a Windows system of Microsoft company, the file system 3300 may be a file allocation table (FAT), an NT file system (NTFS), or the like. In addition, when the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are shown as separate blocks in the present figure, the application 3100 and the file system 3300 may be included in the operating system 3200.

The translation layer 3400 converts an address in a form suitable for the memory device 3500 in response to a request from the file system 3300. For example, the translation layer 3400 converts a logical address generated by the file system 3300 into a physical address of the memory device 3500. Here, mapping information of the logical address and the physical address may be stored in an address translation table. For example, the translation layer 3400 may be a flash translation layer (FTL), a universal flash storage link layer (ULL), or the like.

The memory device 3500 may be a non-volatile memory devcie. In addition, the memory device 3500 may have the structure described above with reference to FIGS. 1A to 3G, and may be manufactured according to the manufacturing method described with reference to FIGS. 1A to 3G. As an embodiment, the memory device 3500 may include a stack including alternately stacked conductive films and insulating films, and an opening penetrating the conductive films and the insulating films, and having a rounded corner that is in contact with (exposed to) the opening, a first channel film formed in the opening and including a first curved surface surrounding the rounded corner, a conductive pad formed in the opening, and a second channel film interposed between the first curved surface of the first channel film and the conductive pad. Because a structure of the memory device 3500 and a method of manufacturing the memory device 3500 are the same as described above, a detailed description thereof will be omitted here.

The computing system 3000 having such a configuration may be divided into an operating system layer that is performed in a higher level region and a controller layer that is performed in a lower level region. Here, the application 3100, the operating system 3200, and the file system 3300 may be included in the operating system layer and may be driven by an operation memory of the computing system 3000. In addition, the translation layer 3400 may be included in the operating system layer or in the controller layer.

As described above, because the computing system 3000 includes the memory device 3500 having an improved degree of integration and an improved operation characteristic, an operation characteristic of the computing system 3000 may also be improved.

What is claimed is:

1. A semiconductor device comprising:
   a stack including alternately stacked conductive films and insulating films, wherein the stack comprises an opening penetrating the conductive films and the insulating films, and wherein the stack comprises a rounded corner that is exposed to the opening;
a first channel film in the opening, the first channel film including a first curved surface surrounding the rounded corner;
a conductive pad in the opening; and
a second channel film interposed between the first curved surface and the conductive pad and including a second curved surface surrounding the first curved surface,
wherein the conductive pad is in contact with the second curved surface, and
wherein the second channel film is separated by an upper surface of the first channel film.

2. The semiconductor device of claim 1, wherein the second channel film is locally positioned on the first curved surface of the first channel film.

3. The semiconductor device of claim 1, wherein the second channel film has a funnel shape, and
wherein the second curved surface entirely surrounds the first curved surface.

4. The semiconductor device of claim 1, wherein the conductive pad comprises:
a first portion that is in contact with the first channel film; and
a second portion that is in contact with the second channel film and having a width different from a width of the first portion.

5. The semiconductor device of claim 1, further comprising:
a gap fill film in the opening.

6. The semiconductor device of claim 1, further comprising:
a memory film interposed between the stack and the first channel film.

7. The semiconductor device of claim 6, wherein the memory film includes a third curved surface surrounding the rounded corner.

8. The semiconductor device of claim 6, wherein the memory film extends to an upper surface of the stack.

9. A semiconductor device comprising:
a source structure;
a bit line;
a stack, positioned between the source structure and the bit line, including alternately stacked conductive films and insulating films, wherein the stack comprises an opening penetrating the conductive films and the insulating films, and wherein the stack comprises a rounded corner that is exposed to the opening;
a channel structure in the opening, the channel structure connected to the source structure; and
a conductive pad connecting the channel structure and the bit line to each other and surrounding the rounded corner,
wherein the channel structure includes a first channel film including a first curved surface surrounding the rounded corner, and a second channel film interposed between the first curved surface and the conductive pad including a second curved surface surrounding the first curved surface, and
wherein the conductive pad is separated from the stack by the channel structure.

10. The semiconductor device of claim 9,
wherein the conductive pad is in contact with the second curved surface.

11. The semiconductor device of claim 9, wherein the second channel film includes the second curved surface surrounding the first curved surface.

12. The semiconductor device of claim 9, wherein the second channel film has an overhang structure.

13. The semiconductor device of claim 9, further comprising:
a gap fill film in the opening.

14. The semiconductor device of claim 9, further comprising:
a memory film interposed between the stack and the channel structure.

15. The semiconductor device of claim 14, wherein the memory film extends along the opening.

16. The semiconductor device of claim 14, wherein the memory film extends to an upper surface of the stack.

17. A semiconductor device comprising:
a stack including alternately stacked conductive films and insulating films, wherein the stack comprises openings penetrating the conductive films and the insulating films, and wherein the stack comprises a rounded corner that is exposed to the openings;
channel structures in the openings, wherein each of the channel structures comprises a first channel film including a first curved surface surrounding the rounded corner and a second channel film including a second curved surface surrounding the first curved surface;
a memory film including a third curved surface surrounding the rounded corner; and
a conductive pad in contact with the second curved surface,
wherein the channel structures in adjacent openings are separated from each other, and
wherein the first curved surface is interposed between the second curved surface and the third curved surface.

18. The semiconductor device of claim 17, wherein the first channel film and the second channel film include a semiconductor material for a channel region.

* * * * *